(12) United States Patent
Li et al.

(10) Patent No.: US 8,932,403 B1
(45) Date of Patent: Jan. 13, 2015

(54) METHOD OF FABRICATING LOW-DISLOCATION-DENSITY EPITAXIALLY-GROWN FILMS WITH TEXTURED SURFACES

(75) Inventors: Qiming Li, Albuquerque, NM (US); George T. Wang, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 882 days.

(21) Appl. No.: 13/113,123

(22) Filed: May 23, 2011

Related U.S. Application Data

(63) Continuation-in-part of application No. 12/388,103, filed on Feb. 18, 2009, now Pat. No. 8,425,681.

(60) Provisional application No. 61/347,586, filed on May 24, 2010.

(51) Int. Cl.
*C30B 21/02* (2006.01)

(52) U.S. Cl.
USPC .................. 117/89; 117/90; 117/95; 117/912; 117/915

(58) Field of Classification Search
USPC ................................ 117/915, 912, 89, 90, 95
See application file for complete search history.

(56) References Cited

U.S. PATENT DOCUMENTS

| | | | |
|---|---|---|---|
| 6,375,738 B1 * | 4/2002 | Sato | 117/89 |
| 7,309,620 B2 | 12/2007 | Fonash et al. | |
| 7,351,906 B2 * | 4/2008 | Yotsuhashi et al. | 136/201 |
| 7,842,134 B2 * | 11/2010 | Whitehead et al. | 117/94 |

OTHER PUBLICATIONS

Sung Jin An, et al, Heteroepitaxial Growth of High-Quality GaN Thin Films on Si . . . , Adv. Mater. 2006, 18, pp. 2833-2836.
Ke Yan Zang, A New Method for Lift-Off of III-Nitride Semiconductors for Heterogeneous Integration, Nanoscale Res Lett (2010) ky-zang@imre.a-star.edu.sg.
Kazumasa Ueda, High Performance of GaN Thin Films Grown on Sapphire Substrates Coated . . . , Applied Physics Letters 92, 101101, 2008.

* cited by examiner

*Primary Examiner* — Bob M Kunemund
(74) *Attorney, Agent, or Firm* — Carol I. Ashby; Kevin W. Bieg

(57) ABSTRACT

A method for forming a surface-textured single-crystal film layer by growing the film atop a layer of microparticles on a substrate and subsequently selectively etching away the microparticles to release the surface-textured single-crystal film layer from the substrate. This method is applicable to a very wide variety of substrates and films. In some embodiments, the film is an epitaxial film that has been grown in crystallographic alignment with respect to a crystalline substrate.

18 Claims, 7 Drawing Sheets

US 8,932,403 B1

METHOD OF FABRICATING LOW-DISLOCATION-DENSITY EPITAXIALLY-GROWN FILMS WITH TEXTURED SURFACES

This patent application claims priority benefit from U.S. provisional patent application Ser. No. 61/347,586, filed on May 24, 2010, which is incorporated herein by reference.

This application is a continuation-in-part of the prior-filed U.S. patent application Ser. No. 12/388,103, entitled "Low-Dislocation-Density Epitaxial Layers Grown by Defect Filtering by Self-Assembled Layers of Spheres," filed Feb. 18, 2009, now U.S. Pat. No. 8,425,681 the contents of which are hereby incorporated by reference.

CROSS-REFERENCE TO RELATED APPLICATIONS

This application is related to the copending application entitled "Low-Dislocation-Density Epitaxial Layers Grown by Defect Filtering by Self-Assembled Layers of Spheres," George T. Wang and Qiming Li, U.S. patent application Ser. No. 12/388,103, filed Feb. 18, 2009, which is incorporated herein by reference.

The United States Government has rights in this invention pursuant to Department of Energy Contract No. DE-AC04-94AL85000 with Sandia Corporation.

BACKGROUND OF THE INVENTION

When a layer of material, including in some cases an epitaxial layer, is grown upon a substrate, it is sometimes desirable to be able to remove the film intact from the substrate. This can provide a free-standing layer or film of the material that has been grown, and it can make the substrate available for use again as a growth substrate for another layer of the material. For semiconductor and other potentially light-emitting materials that are to be employed in light-emitting devices, the degree to which the internally generated light is emitted for use external to the device can be greatly enhanced by having a textured surface for enhanced outcoupling of the light.

Numerous post-growth processing techniques have been employed to provide textured surfaces that couple light more efficiently out of a semiconductor light-emitting device, such as light-emitting diodes and a laser diodes. Such post-growth processes add to the complexity of device fabrication. Lithography followed by dry etching, wet etching, or a combination of the two are typically used for creating textured surfaces. A simpler, more direct approach would be desirable.

BRIEF DESCRIPTION OF THE DRAWINGS

The accompanying drawings, which are incorporated in and form part of the specification, illustrate some embodiments of the present invention and, together with the description, serve to explain the principles of the invention.

In FIG. 3a, a layer of spheres sits atop the surface of a substrate with a significant number of threading dislocations. In FIG. 3b, material has been grown upward from the dislocated substrate past the spheres and coalesced to form smooth surface.

DETAILED DESCRIPTION OF THE INVENTION

This invention comprises a semiconductor structure with a textured surface that has been grown as an integral part of a semiconductor structure during an epitaxial growth process. The semiconductor structure can comprise a single semiconductor material; the semiconductor structure can alternatively comprise a plurality of semiconductor materials differing in chemical composition and/or doping type and/or dopant concentration. The method of growth of the semiconductor structure produces a very low threading dislocation density and an integral textured surface that comprises an ordered distribution of pits mirroring an array of microparticles employed in the growth of the semiconductor structure, which has very high crystalline quality. The invention also comprises the method of forming such textured semiconductor structures.

Fabrication of the structures of embodiments of this invention employs a method for film liftoff by growing a film atop a layer of microparticles on a substrate and subsequently selectively etching away the microparticles to release the film layer from the substrate. The released film layer has a surface texture comprising an ordered distribution of pits substantially mirroring the shape and distribution of the microparticles employed in the growth process. The ordered distribution of pits may be described as an array of concavities of substantially inverse spherical profile when microspheres are employed as the microparticles. The method of this invention is applicable for producing a very wide variety of substrates and films from a wide variety of materials. In some embodiments, the textured film is a homoepitaxial or heteroepitaxial film that has been grown in crystallographic alignment with respect to a crystalline substrate. An example of one such embodiment is the lift-off of GaN that has been grown atop a layer of silica microsphere that had been formed atop a GaN thin film that had been epitaxially grown on a sapphire substrate. In some embodiments, epitaxial growth of a low-threading-dislocation-density GaN film has been performed by growing GaN up through the interstices that exist between a close-packed array of silica spheres resting on a GaN layer that had been grown on a sapphire substrate. A detailed discussion of the preparation of this structure is provided in the patent application entitled "Low-Dislocation-Density Epitaxial Layers Grown by Defect Filtering by Self-Assembled Layers of Spheres," George T. Wang and Qiming Li, U.S. patent application Ser. No. 12/388,103, filed Feb. 18, 2009, which is incorporated herein by reference.

Figure 1:
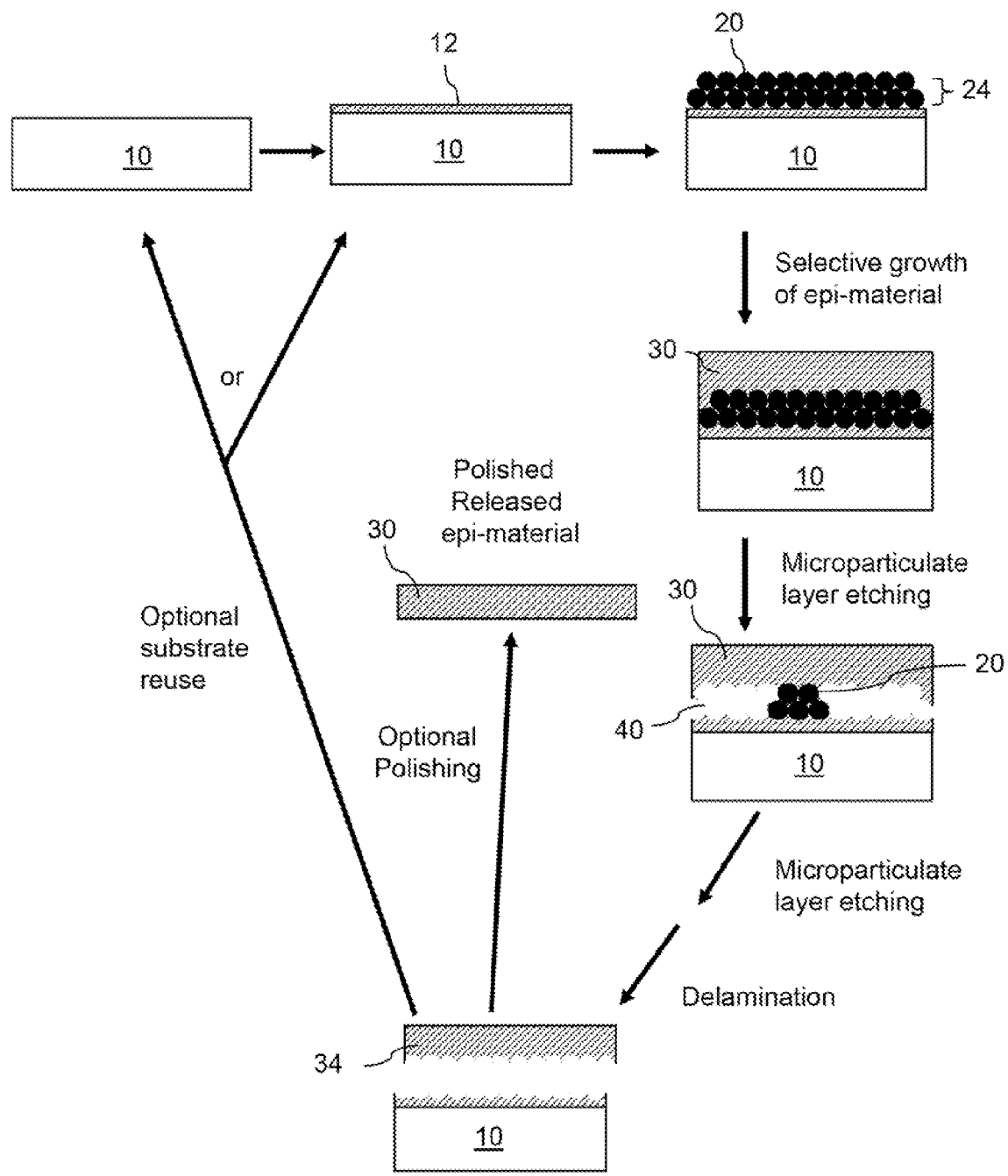
FIG. 1 illustrates one embodiment wherein a layer of epitaxially grown material is released from a substrate upon which it has been grown atop a microparticulate release layer.
Figure 2:
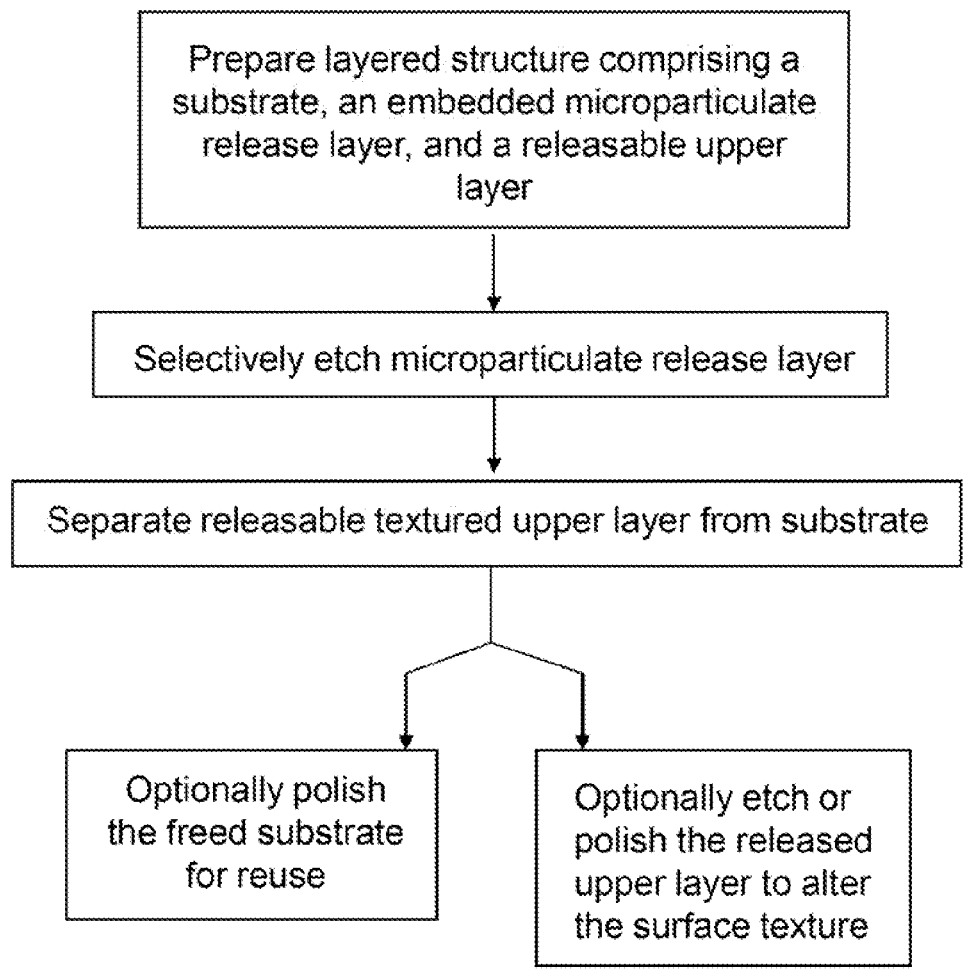
FIG. 2 presents a flowchart for some embodiments.

One embodiment is illustrated in FIG. 1. Embodiments of the invention comprise the deposition of self-assembling microparticles 20 such as microspheres onto a base layer comprising the material 12 that has been previously grown on a substrate 10. While the following description is presented in terms of microspheres, microparticles with nonspherical shapes may also be used in some embodiments. The self-assembled spheres (or other microparticles) create a defect blocking layer as the material grows through the interstices/ voids between the spheres, filling the voids between spheres with epitaxially aligned material. Continued growth produces a continuous material overlayer 30 atop the layer of spheres. The spheres 20 atop the initial material base layer 12 intercept vertically-propagating threading dislocations and prevent their continuation upward into the overlayer of material. The dislocation-blocking action of the sphere blocking layer 24 enables growth of very low dislocation density material. In various embodiments, micrometer-scale spheres 20 are self-assembled into one or more close-packed layers 24 using well controlled solvent evaporation conditions. These spheres create an interconnected network of voids, into which the material can be selectively grown. Even a single layer of spheres produces a dramatic reduction in the threading dislocation density. Reduction in threading dislocation density is also obtained when the layer of spheres comprises greater than one monolayer, as shown in FIG. 1. The largest fraction of the reduction in dislocation density is obtained with substantially one monolayer of spheroidal particles. In some embodiments, the improvement in dislocation density obtained with multiple layers is not significantly greater than with a single layer. Employment of two or more layers 24 facilitate subsequent removal of the grown layer by providing greater ease of access of an etching solution to the microparticles. Spheres block and filter out substantially vertically propagating dislocations that are propagating directly upward into the spheres and adjacent voids or that are propagating sufficiently close to the spheres that the dislocations bend into the spheres or associated voids. Dislocations terminate upon encountering a void or sphere. A dislocation that terminates at either location is defined as terminating adjacent to the spheroidal particles. Following this defect filtering, coalescence of a smooth and continuous material film 30 results above the top sphere layer. This self-assembly-based technique provides defect filtering, controlled simply by the size of spheres and number of sphere layers deposited, without any lithography, and allows for a single material growth step to be used to obtain low-dislocation-density material layers. Subsequent etching of the sphere layers 24 produces a void 40 between the layer 12 and the upper epitaxial material layer 30 and serves to release the textured low-dislocation-density material layer 34 from the substrate. The surface of the released material layer substantially mirrors the surface profile of the microparticulate layer 24. FIG. 2 presents a flowchart for an embodiment of the invention. In some embodiments, if the epilayer 30 atop of the microsphere layer 24 is sufficiently thick, the built-in strain caused by lattice mismatch and/or thermal expansion coefficient differences during cooling down from growth temperature can be sufficiently high to cause self-separation of the epilayer from the substrate without employing a post-growth etching process to release the layer.

After release of the textured epitaxial layer, one can prepare the substrate for reuse in subsequent growths by polishing the substrate to restore a smooth seed layer 12 or to restore the original substrate surface (surface of 10 before growth of epitaxial seed layer 12.

For some applications a reduction of the surface texture of the textured epitaxial layer 34 may be desired. For such applications, the textured epitaxial layer can be etched or polished to remove some or all of the as-grown texture. A smooth texture can be obtained in some embodiments by sufficient etching or polishing.

Embodiments of this invention are described below in terms of demonstrated embodiments using a compound semiconductor, in this case GaN, that is commonly grown on a lattice-mismatched substrate, but the process is quite general and is also applicable to many other semiconducting and non-semiconducting materials where threading-dislocation-density reduction and/or crack reduction is desired.

The spheroidal particle provides a curved interface with the growing material that serves to terminate dislocations propagating into the interface either directly or as a result of the dislocation being redirected toward the interface. The gently curved geometry in the region where lateral growth becomes important to produce a coalesced film avoids the sharp corners, such as are found at the edge of epitaxial lateral overgrowth (ELO) masks, that lead to wing tilt and the resulting generation of dislocations upon coalescence of tilted wings.

Figure 3A:
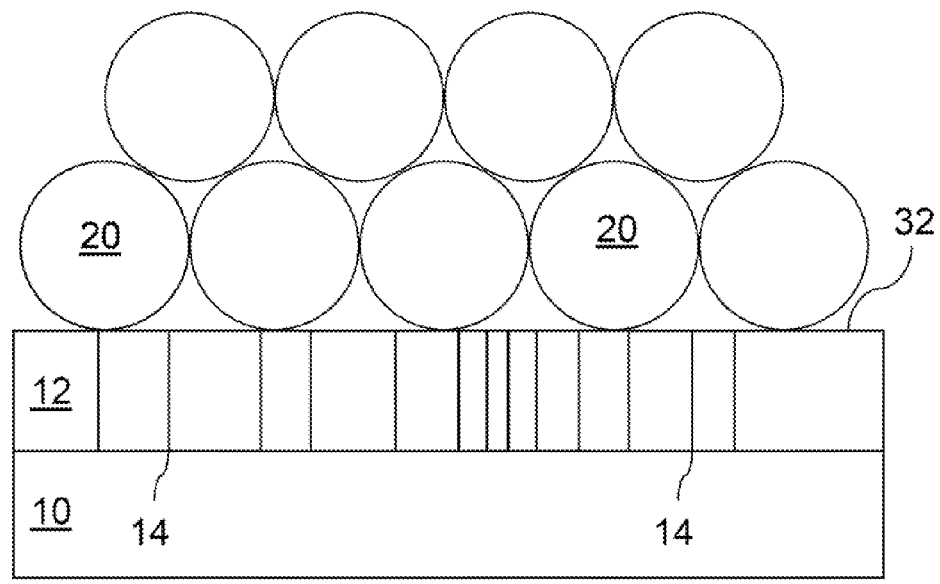
FIG. 3a and FIG. 3b illustrate a cross-sectional view of an embodiment made by one embodiment of the process of this invention.
Figure 3B:
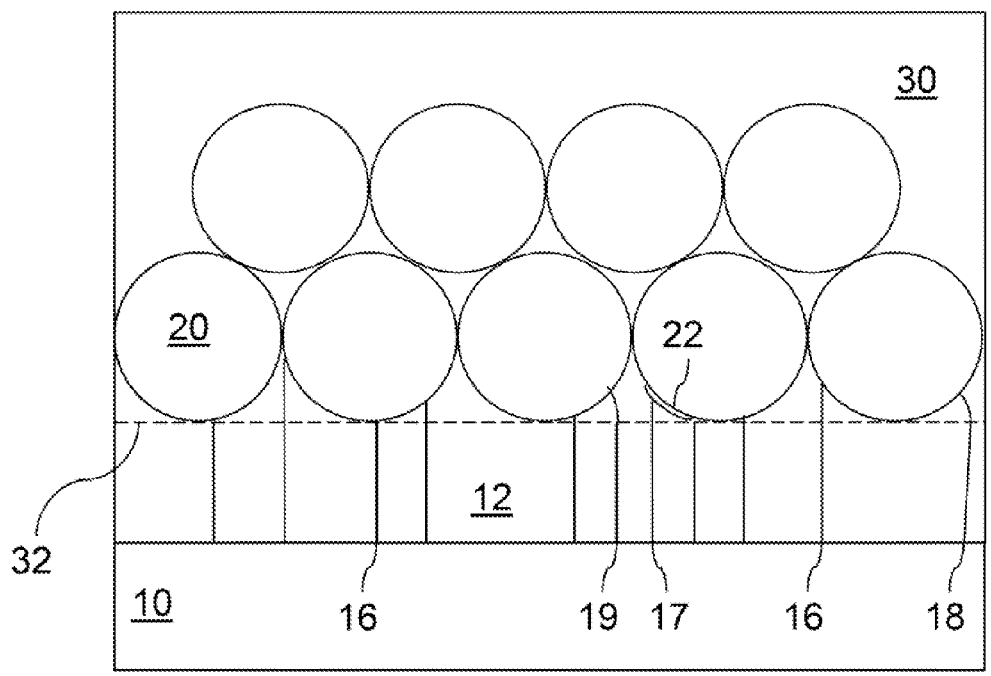
Figure 4:
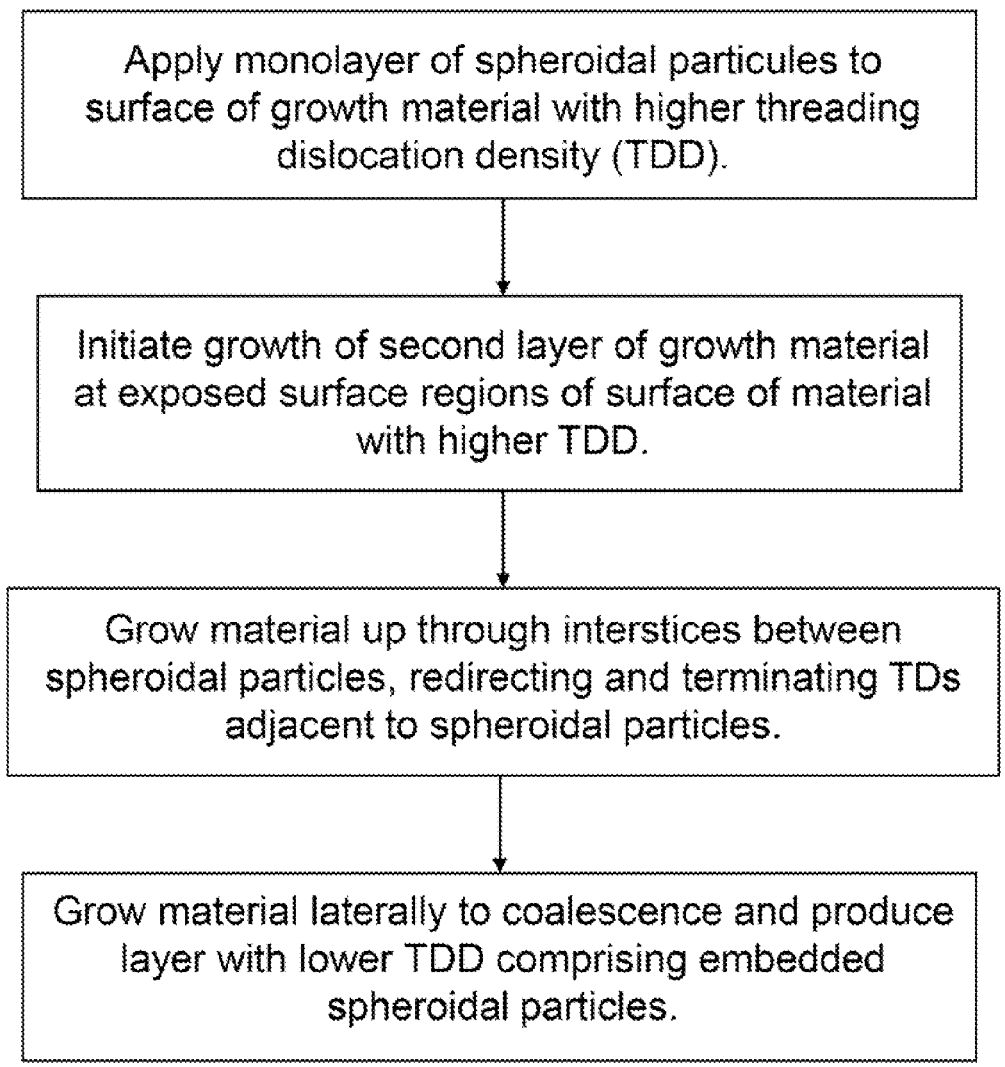
FIG. 4 illustrates a flowchart for a growth portion of an embodiment.

FIG. 3 illustrates formation of the layer that is to be removed from the substrate in an embodiment of this invention; dimensions are not to scale. A structure with two layers of microparticles is illustrated in FIG. 3, but additional layers of microparticles may also be employed. More rapid removal of the microparticle layer can be facilitated by the use of more microparticle layers, which allows more ready access of an etching solution. A flowchart for the material growth portion of one embodiment is illustrated in FIG. 4. Atop a substrate 10, a layer 12 of the desired material is grown. Because of lattice mismatch and/or differences in thermal expansion coefficients, many threading dislocations 14 can be present in layer 12. Atop the material layer 12, one or more layers of spheres 20 are applied. Surface treatments may be employed to facilitate the application or adherence of the spheres to establish and maintain their contact with the material layer. This is illustrated in FIG. 3a. Following return to the material growth reactor, additional growth (regrowth) of the material upward from the surface 32 of the initial material layer 12 past the layer of spheres is performed to form a layer 30 in which the spheres are embedded. This is illustrated in FIG. 3b. Some dislocations 16 can be terminated when they propagate vertically into the sphere. Other dislocations 18 and 19 that do not propagate straight into a sphere are bent toward the sphere as they propagate upward. As the material grows, some voids 22 may form at the underside of a sphere 20. Dislocations 17 that intercept the void are removed. Since the role of the spheres is the interception and/or redirection of threading dislocations that are propagating upward from the base layer 12 into the material layer 30 that is growing into the voids between the spheres and then over the spheres, a greater reduction in threading dislocations in the final material layer 30 will result when the base layer surface is more completely covered by spheres before subsequent growth. In addition, starting with a material base layer 12 with a lower initial dislocation density can improve the final dislocation density in the regrown layer 30.

Figure 5:
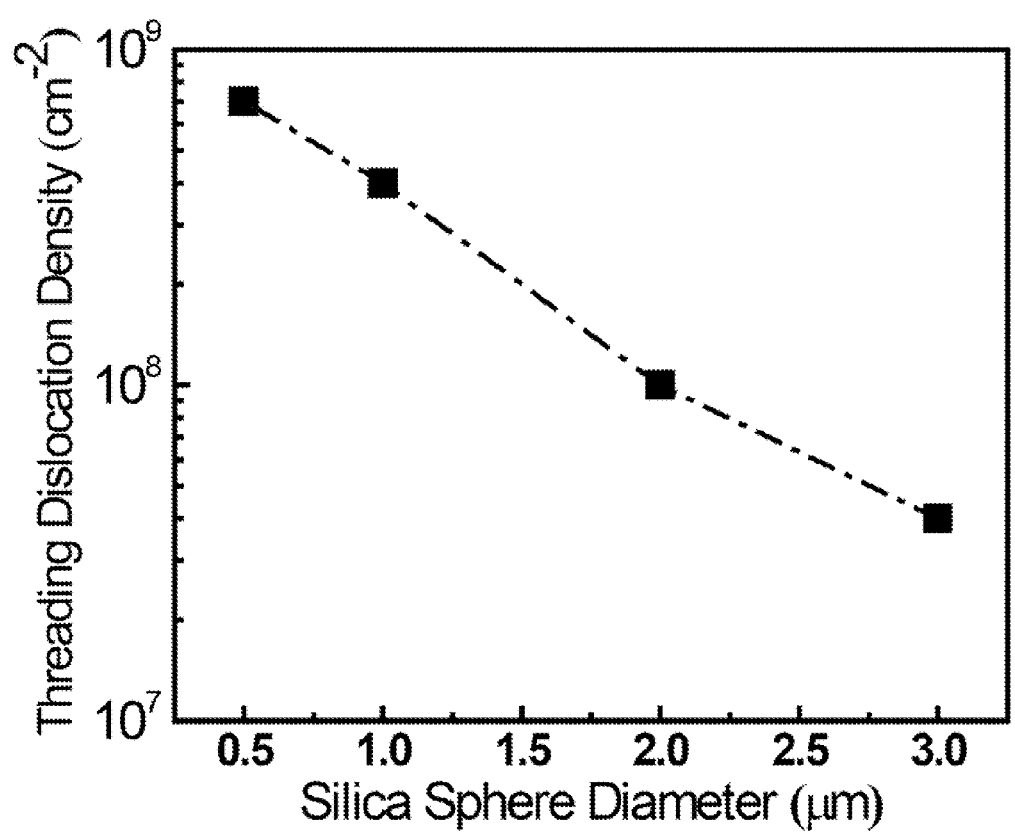
FIG. 5 illustrates the effect of particle size on the threading dislocation density in GaN.

The size of the spheres employed affects the degree of dislocation reduction. FIG. 5 presents the threading dislocation density as a function of microsphere diameter when a single layer of microspheres are employed. The results for monolayers of spheres up to 3 micrometers in diameter are presented in the figure. In general, the reduction in threading dislocation density is greater with larger spheres. Spheres of larger diameter than 3 micrometers may also be employed. There is a practical rather than a fundamental limitation to the upper diameter that one may choose to employ. One may conveniently employ larger spheres when using a growth technique, such as HVPE (hydride vapor phase epitaxy), that allows a high growth rate. While larger diameter spheres produce a greater reduction in dislocation density, they also require the growth of a thicker layer of material before the sphere is embedded and the materials coalesces atop the sphere to form a planar surface. The growth of the thicker layer increases the amount of reactor time required to provide the low-dislocation-density surface that can be subsequently employed, for example, as a low-dislocation-density substrate for electronic and optical devices. If longer reaction times are acceptable, larger spheres may be used for even greater dislocation reduction. Spheres between approximately 100 nm and 100 micrometers can be used in various embodiments.

The dislocation density was measured for structures grown with different sizes of sphere. Atomic force microscopy (AFM) images and cathodoluminescence (CL) have been used to examine the threading dislocation density following growth at 1050° C. at 450 Torr for 3 hours. The starting substrate had a treading dislocation density of approximately $3 \times 10^9/cm^2$. With 500-nm silica spheres, 185 dislocations were counted in a 3×3 micrometer area, corresponding to a dislocation density of $7.4 \times 10^8/cm^2$. With 1-micrometer silica spheres, 105 dislocations were counted in a 3×3 micrometer area, corresponding to a dislocation density of $4.2 \times 10^9/cm^2$. With 2-micrometer silica spheres, 36 dislocations were counted in a 3×3 micrometer area, corresponding to a dislocation density of $1 \times 10^9/cm^2$. With 3-micrometer silica spheres, 2 dislocations were counted in a 3×3 micrometer area, corresponding to a dislocation density of $4 \times 10^7/cm^2$. Larger spheres were not examined as part of this data set due to the limited growth time, but it is to be expected that further reduction in threading dislocation density may be achieved with larger spheres. The significant reduction in threading dislocation density achieved by growth through the 3-micrometer silica spheres is further confirmed by cathodoluminescence (CL) imaging over a much larger 27.5×27.5 micrometer area. For an area grown without the silica sphere layer, the dark spots corresponding to nonradiative recombination in the vicinity of dislocations in the CL image are too dense to be individually resolved. For the GaN layer with the 3-micrometer silica sphere layer, a dislocation density of $4.0 \times 10^7$ cm$^{-2}$ is measured based on the density of the dark spots.

Three mechanisms contribute to the large reduction in threading dislocation (TD) density in embodiments of this invention. The first mechanism is the direct dislocation blocking by the silica spheres. In epitaxial lateral overgrowth (ELO), TDs propagating in the vertical direction are blocked by the dielectric overlayer. Material overlying the dielectric layer is grown laterally over the mask as growth proceeds laterally from the GaN that has grown upward through the window strip area. Fewer dislocations are found in the laterally grown material than in the vertically grown material.

The reduction in TD density obtained with embodiments of this invention is not explained only by direct TD blocking. In that case, one might expect a TD density reduction of approximately 6 fold, as calculated by the ratio of total substrate area to the opening area between the neighboring spheres. However, a reduction in TD density of nearly two orders of magnitude is observed on the regrowth layer. This reduction can be attributed to dislocation bending that serves as a highly effective method for reduction of vertically propagating TDs. In cross-sectional TEM (XTEM) images of structures grown using the method of this invention, the redirecting of vertically propagating dislocations to intercept the spherical nanoparticles is observed, as illustrated schematically in FIG. 3. In some cases, TDs 18 may change their propagating directions to an angle that is approaching normal to the GaN/silica interface. This phenomenon may be explained by the dislocation following a path of minimum elastic energy per unit of growth length of materials. In an ideal isotropic crystal with a constant energy factor k for different orientations, there is a tendency for a dislocation to bend to try to achieve a vertical orientation with respect to a crystal surface or an interface with dielectric materials in order to minimize the dislocation's its total length. In an anisotropic crystal, such as GaN, the TD bending angle is additionally influenced by the magnitude of its Burger's vector, the orientation of the dislocation, and the orientation of GaN surface/interface. Creating a large-area growth surface or interface is beneficial for bending dislocations. In typical ELO, the growth surface is limited by facet formation, which is strongly influenced by the growth conditions. For typical ELO template designs and typical GaN facets that form during ELO, the GaN surface is less than 0.5 units per unit of the substrate area. In embodiments of this invention, the GaN/dielectric interface is defined by an array of close-packed silica spheres. For the geometry of close-packed spheres; the interface area is approximately 7.2 per unit substrate surface area. This very large growth interface is highly efficient for bending TDs. Additionally, the sides of silica spheres create a deeply inclined growth interface, which may bend dislocations 19 that are not directly terminated by the silica and which might potentially escape through the openings between the neighboring spheres if not bent. In addition, TD bending occurs not only near the silica but also in the region above the spheres. This addition bending may due to the faceted island formation when GaN is selectively grown in the windows exposure at the openings between the spheres. These bending mechanisms together contribute to the observed dislocation reduction.

Figure 6A:
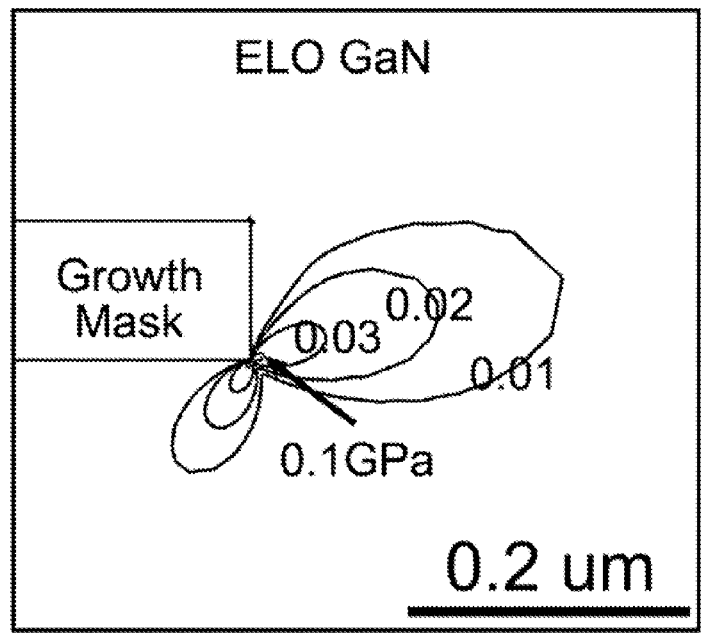
FIG. 6a, FIG. 6b, FIG. 6c and FIG. 6d present the calculated shear strain profile in GaN grown adjacent to a sharp-cornered ELO mask (FIG. 6a and FIG. 6c) and adjacent to a spheroidal particle (FIG. 6b and FIG. 6d).
Figure 6B:
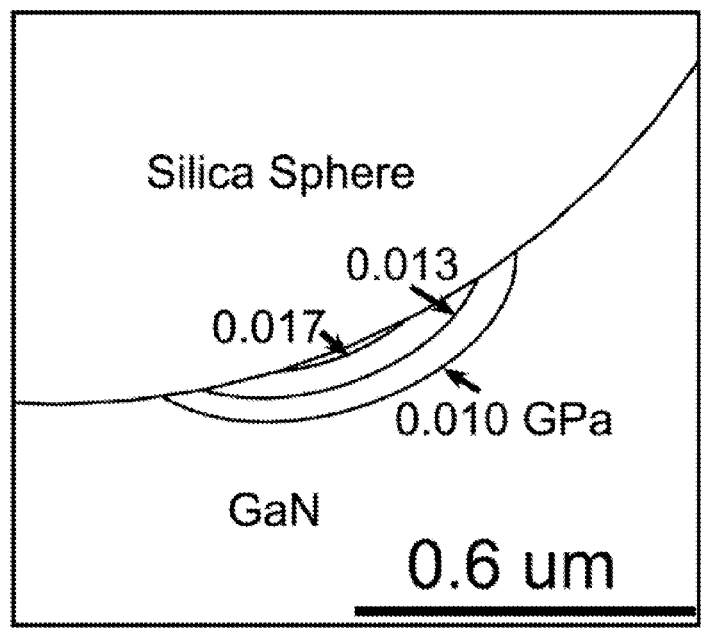
Figure 6C:
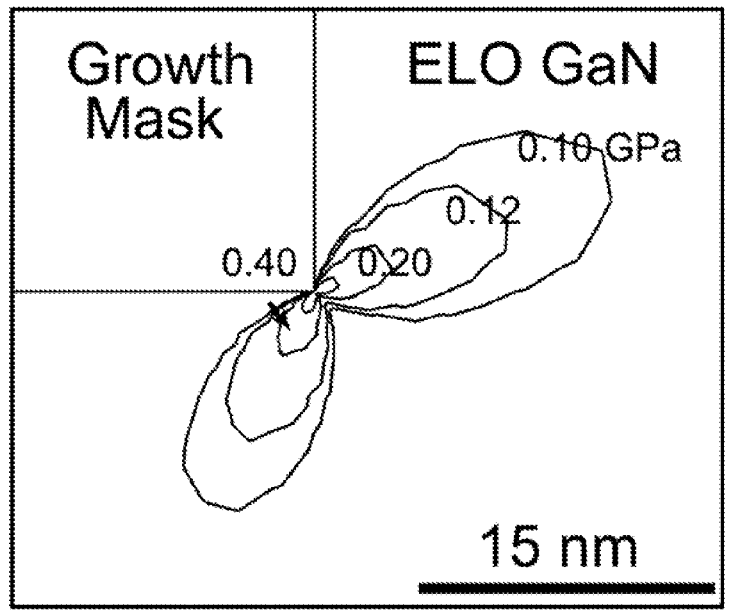
Figure 6D:
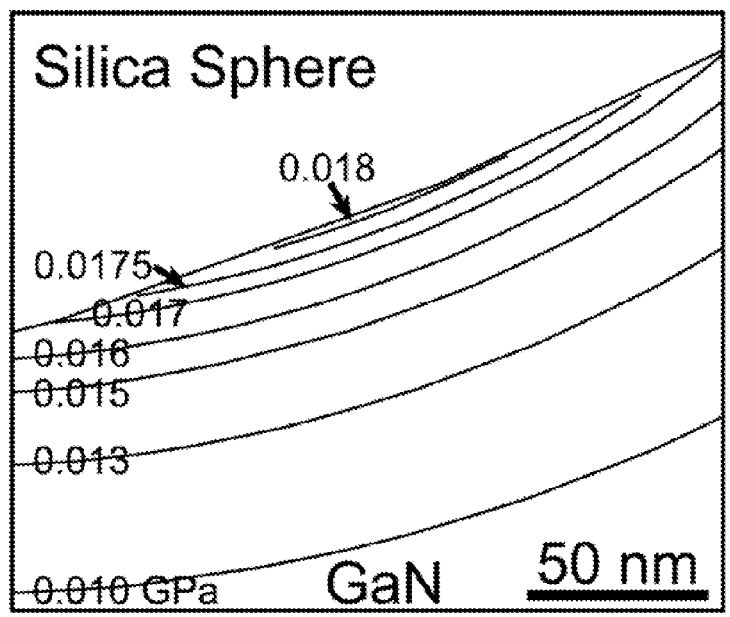

In typical ELO, TDs form at the interface where the laterally growing material coalescences over the dielectric growth mask. This phenomenon is generally attributed to tilting of the laterally growing GaN (GaN wing tilt) due to the presence of high-intensity shear strain in the GaN near the corner of the dielectric growth mask. In embodiments of this invention, sharp corners are not present at the nitride/dielectric interface but are replaced by curved surfaces. The curved surfaces do not display high-intensity shear strain. FIG. 6 illustrates results of a calculation of the static shear strain intensity and strain energy density in GaN around SiO$_2$ spheres using finite element analysis. In the calculation, a uniform shrinkage of a GaN epilayer is imposed to simulate an experimentally observed growth-related tensile strain on the order 0.2 GPa in a planer GaN epilayer on sapphire. The same magnitude of shrinkage is then applied to the silica spheres sample geometry for the strain distribution calculation. In FIGS. 6a and 6c, the calculated strain in an ELO geometry is presented, where the seed window strip width, growth mask width, and the growth facet are set to 3 micrometers, 9 micrometers, and 60°, respectively. A maximum shear strain of approximately 0.4 GPa is found near the corner of the silica growth mask. This high value can to multiply dislocations and cause the tilting of GaN wing regions. For the microspheres presented in FIGS. 6b and 6d, the maximum shear strain of approximately 0.02 GPa occurs near the bottoms of the spheres. High-intensity shear strain is largely eliminated due to the gradual curvature of the spherical surface. The absence of the high shear strain minimizes the GaN wing tilt as the GaN grows laterally over the top of the spheres and prevents the dislocation generation so typical of ELO when GaN coalesce over the silica spheres. The more gradual curvature of the larger spheres may at least in part contribute to the much lower TD density observed with the larger spheres.

Vertically propagating threading dislocations are generally absent directly over the spheres when the spheres are situated atop a GaN substrate layer. This is the opposite of the situation observed when the spheres are directly in contact with nonnitride base substrate as in the method of Ueda. In the method of Ueda, vertically propagating threading dislocations are reported to occur directly over the silica spheres. This is in contrast to the virtual absence of vertically propagating dislocations directly over the silica spheres in this present invention.

In selecting a particular sphere size to employ in various embodiments, the length of time required to embed the sphere and grow the thicker material layer needed to form the coalesced layer over the top of the larger spheres is of consideration. Practical time constraints on how long one wants to grow to achieve a coalesced planar surface may be as important as the desire to further reduce the threading dislocation density. Such considerations can be decided in light of the application intended for the final coalesced structure.

In addition to curvature effects, larger spheres may contribute some improvement in material quality because there are fewer openings per unit area up through which the material will be growing. This can reduce problems that may arise from the coalescence intersection of laterally growing material that may possess slightly different orientations.

In one embodiment, a 2-micrometer-thick GaN base layer was first deposited onto c-plane sapphire (the base substrate) using metal-organic chemical vapor deposition (MOCVD) This GaN growth on sapphire employed a low-temperature GaN buffer technique, resulting in a threading dislocation density of $3\times10^9/cm^2$, as measured by cathodoluminescence and AFM imaging. The base layer was treated either with a mixture of $H_2O_2$ and $H_2SO_4$ or an oxygen plasma to produce a hydrophilic GaN surface for the silica microsphere assembly. A monolayer of silica microspheres were assembled on the GaN surface as follows. A hydrophobic surface is prepared on silica spheres. Various processes can be employed to obtain hydrophobic silica surfaces and can be used; such surface treatments are known to those of skill in the art and many would be suitable for use as the pretreatment in embodiments of this present invention. In this embodiment, silica spheres were dissolved in ethanol. The silica surface was made hydrophobic by addition of allyltrimethoxysilane to the ethanol suspension. Excess surfactant was removed by centrifugation and dialyzation against chloroform. The extract was dissolved in chloroform for monolayer formation. The suspension was evenly spread on a water surface in a Langmuir-Blodgett trough to form a monolayer. The hydrophilic GaN sample was pulled out of the water at a controlled rate. The samples were dried in air and no further treatment was employed before the GaN regrowth.

In one embodiment, a 2-μm-thick GaN layer was first deposited onto c-sapphire by metal-organic chemical vapor deposition (MOCVD) Trimethylgallium (TMG) and $NH_3$ were used as precursors with a flow rate of 0.11 μmol/min (2.4 sccm) and 10.5 slm, respectively. $H_2$ and $N_2$ are used as carrier gases at a flow rate of 9.5 SLM and 8 SLM, respectively. The GaN growth on sapphire employed a low-temperature GaN buffer technique, resulting in a threading dislocation density of $3\times10^9$ $cm^{-2}$, as measured by cathodoluminescence imaging. The samples were subsequently treated in an $O_2$ plasma or $H_2SO_4$:$H_2O_2$ mixture (4:1 by volume) to obtain a hydrophilic GaN surface for silica microsphere assembly.

A monolayer of silica microsphere was assembled on the GaN surface following a modified process reported by S. Reculusa and S. Ravaine, "Synthesis of Colloidal Crystals of Controllable Thickness through the Langmuir-Blodgett Technique," Chem. Mater. vol. 15 (2003) pp. 598-605. The key steps of the process are summarized as follows First, 0.25 mg of 100% of silica spheres with a diameter of approximately 3 micrometers is dissolved in 1.5 mL ethanol. To functionalize the silica surface to make them hydrophobic, 3 μl of allyltrimethoxysilane is added to the silica sphere ethanol suspension. Following mixing, the suspension is heated to approximately 90° C. while stirring for 2 hours. The suspension is then centrifuged and dialyzed against chloroform to remove excess surfactant. The extract is dissolved in 1 mL chloroform for use in monolayer formation. Approximately one hundred micro-liter of the suspension is evenly spread on a water surface in a Langmuir-Blodgett trough with a working dimension of 7.5×36.5 cm. The film is compressed at a rate of 1 mm/min. When the film area is compressed to approximately 30% of the initial area, the surface tension rapidly rises to approximately 40 mN/m. The hydrophilic GaN sample is pulled out of the water at the rate of 2 mm/min while maintaining the surface tension at 38±3 mN/m. The samples are dried in air and no further treatment is required before the GaN regrowth.

To achieve better reduction of threading dislocation density, growth conditions for the upper layer are selected that will produce selective growth of the growth material epitaxially from the layer of material atop the bulk substrate while not producing significant growth directly on the particles. This is achieved by selecting a temperature that is not excessively high so as to lead to loss of selectivity for growth on the growth material versus on the particles but is high enough to discourage condensation on the particles. Use if a reactive gas mixture that contains components that suppress nucleation and growth on the particles is helpful. Chemical species that adjust the particle surface chemistry to discourage the initial nucleation or that etch away any nuclei that may have formed on the particles are helpful in achieving this end. Control of the ratio of precursor gases can also help reduce any contribution to nucleation upon the particle surface. For example, for the growth of GaN, a large V-to-III ratio discourages elemental Ga formation on the particles, which can lead to polycrystalline films. Variation of the pressure during the course of the reaction can improve conditions for initial nucleation, growth upward through the interstices, facet formation, or lateral growth as may be most advantageous at different times in the total reaction.

GaN was selectively grown by MOCVD through the self-assembled sphere layer to achieve a fully coalesced GaN film. When 3-micrometer spheres were employed, an approximately 12-micrometer-thick film was grown over the sphere layer A typical growth condition contains a 45-minute GaN growth step at 450 Torr with 8.6 SCCM TMG and 10.5 SLM $NH_3$ and a 5-hour growth step at 50 Torr with 2.6 SCCM TMG and 10.5 SLM $NH_3$. For both steps, the growth temperature, $H_2$ flow rate, $N_2$ flow rate, and spin rate are 1050 C, 9.5 SLM, 8 SLM, and 1500 RPM, respectively. Samples were characterized by scanning electron microscopy (SEM), cross-sectional transmission electron microscopy (XTEM), atomic force microscopy (AMF), and cathodoluminescence (CL).

In some embodiments following self-assembly of the spheres, GaN was selectively grown by MOCVD through the interstices of the spheroidal particle layer and coalesced to produce a fully coalesced GaN layer approximately 12 micrometers thick. The spheroidal particles are encapsulated near the starting GaN layer adjacent to the base substrate. To enable imaging of the threading dislocations using atomic force microscopy (AFM), the GaN surface was exposed to $SiH_4$ at 860° C. for approximately 2 min. The samples were characterized by scanning electron microscopy (SEM), cross-sectional transition electron microscopy (XTEM), AFM, and cathodoluminescence (CL). TEM samples were prepared by focused ion beam.

When approximately 3-μm silica spheres are assembled on a GaN-on-sapphire substrate, the silica spheres form close-packed domains with dimensions on the order of approximately 40 μm. From an SEM image of the surface, a silica sphere density was measured to be 1183 mm$^{-2}$. This density translates into a surface coverage of 83.6% by the silica microspheres, which is close to the maximum coverage (90.7%) that would be produced by a silica sphere array of ideal close packing. The difference between the observed coverage and the ideal coverage is probably due to sphere stacking disorders occurring on the domain boundaries and to vacancies present within the domains.

In some embodiments, the gallium nitride that grows through the interstices and around the spheroidal nanoparticles and coalesces to form an approximately planar low-dislocation-density layer was grown as follows. Trimethyl gallium (TMG) at a flow rate of 0.11 micromole/min (8.6 sccm) and ammonia at a flow rate of 10.5 slm were used. Reaction was conducted for 45 min. at a pressure of 450 Torr. Pressure and TMG were decreased to 50 Torr and 2.6 sccm, respectively; reaction was continued for 5 hours. The reaction temperature was approximately 1050° C.

Other pressures and temperatures may be used in different embodiments of this invention. Reaction conditions that produce good vertical growth rates can be used for initiation of growth and growth of material upward through the interstices. For GaN, temperatures between approximately 500° C. and approximately 1400° C. may be employed. For a particular set of reaction conditions, a temperature that does not facilitate direct nucleation of GaN on the microspheres produces better quality material. The initiation step can be performed with pressures between approximately 200 Torr and approximately 760 Torr. Higher pressures tend to favor vertical growth over lateral growth, so pressures between approximately 200 Torr and 760 Torr may be used. Lower pressures favor lateral growth to achieve coalescence. Pressures between approximately 1 Torr and approximately 200 Torr favor lateral growth.

While the base substrate in some of the preceding embodiments was sapphire, other substrates may also be employed. Substrates suitable for embodiments of this invention for the growth of Group III nitrides include but are not restricted to a higher-dislocation-density Group III nitride itself, GaN, sapphire, silicon carbide, silicon, germanium, ZnO, MgO, MoS$_2$, MgAl$_2$O$_4$, NdGaO$_3$, AlN, GaAs, GaP, Hf, Sc, Zr, TiN, ScN, ZrN, and LiGaO$_2$. A variety of precursor gases may be used for the growth of Group III nitride materials in embodiments of this invention. Examples include but are not restricted to Group III precursor selected from the group consisting of gallium, trimethyl gallium, triethyl gallium, gallium trichloride, gallium-containing hydrocarbon compounds, aluminum, trimethyl aluminum, triethyl aluminum, aluminum trichloride, aluminum-containing hydrocarbon compounds, indium, trimethyl indium, triethyl indium, indium trichloride, and indium-containing hydrocarbon compounds, and a Group V precursor selected from the group consisting of ammonia and nitrogen.

In some embodiments, it is desirable to employ conditions that inhibit nucleation and growth of the growth material directly on the spheroidal particles. Condition that inhibit such nucleation and growth include but are not restricted to those whose mechanisms discourage the initial nucleation process and also those that etch away any nuclei or growing material that might begin to form on the particles' surfaces. In embodiments involving GaN, these include high growth temperature, or low growth pressure, or introducing H, F, Cl, and/or Br containing gas species such as H$_2$, NH$_3$, HF, F$_2$, Cl$_2$, HCl, HBr, GaCl$_2$ in MOCVD (metal-O=organic chemical vapor deposition), HVPE (hydride vapor phase epitaxy), or CVD (chemical vapor deposition) reactors.

The preceding discussion was presented in terms of embodiments where the spheres were placed upon a GaN-on-sapphire substrate. Alternative Group III nitrides can also be employed, as can alternative base substrates upon which the Group III nitride is grown before application of the layer of spheroidal particles. For example, in another embodiment, a Si(111) wafer was employed as the base substrate. A compositionally graded buffer layer was grown as follows. A Si(111) wafer was heated to 1100° C. Trimethylaluminum (TMA) and ammonia were introduced at a flow rate of 0.2 sccm and 2.5 slm, respectively. This initial growth was performed for approximately 15 min and approximately 30 nm of AlN was grown on the Si(111) surface. A graded-composition GaAlN layer was then grown on the initial AlN layer over a period of approximately 25 minutes by gradually increasing trimethylgallium (TMG) flow rate from 0 to 2.5 sccm, increasing NH$_3$ flow rate from 2.5 to 10.5 slm, decreasing the growth temperature from 1100 to 1050° C., and decreasing the TMA flow rate from 0.2 to 0 sccm. A layer of approximately 0.5 micrometer-thick GaN was then grown at 1050° C. and with TMG and NH3 flow rate of 2.5 sccm and 10.5 slm, respectively. Flow rates, times, and temperatures may be varied in different embodiments, as known to those of skill in growing these materials, to obtain a compositionally graded buffer layer of variable thickness upon which the upper GaN layer may be grown. The thickness of the GaN layer can also be widely varied provided one achieves a substantially crack-free GaN layer upon which spheroidal particles can be deposited. The base substrate with this compositionally graded first Group III nitride layer upon it was removed from the reactor and had applied to its surface approximately a monolayer of 3-micrometer silica spheres using a Langmuir Blodgett technique. After reloading the wafers in an MOCVD reactor, a regrowth of GaN was performed using the conditions described above for growing GaN using sapphire-based substrates. The dislocation density of the resulting substrate structure was measured using large-area cathodoluminescence scans. The measured dislocation density was approximately 6×10$^7$/cm$^2$. For comparison, growth under the same conditions but without the sphere layer produced GaN with a dislocation density on the order of 10$^{10}$/cm$^2$.

For many materials, substrates of the material itself that have higher dislocation densities than desired may be available. For materials where growth kinetics in different crystallographic directions enable selective lateral growth approaches, embodiments of this invention can produce lower dislocation-density surfaces. Embodiments of this invention may be used to produce lower dislocation densities that those initially present in such cases. In such embodiments, the spheroidal particles are applied to the surface of the higher dislocation density material. A surface treatment may or may not be employed to obtain good adhesion of the spheroidal particles to the material so that the particles remain substantially in contact with the higher dislocation density material. After application of the particle layer, growth or regrowth of the material to embed the particles is performed. The threading dislocations propagating up from the higher dislocation density layer are redirected and/or terminated when they encounter the surface of the particles that face toward the higher dislocation density layer or encounter voids adjacent to that part of the surface of the particles. This portion of the surface may be described as the hemispherical portion facing toward the higher dislocation density material although the shape of the surface need not be exactly hemispherical. The material that grows past the particle and laterally across the hemispherical surface that faces away from the higher dislocation density material will have a dislocation density that is at least an order of magnitude lower than that of the higher dislocation density material. One such embodiment would be the growth of lower dislocation density GaN on a higher dislocation density GaN wafer.

While the preceding embodiments and descriptions have employed the terms spheres and balls, it is to be recognized that the invention also includes nonspherical shapes that can serve to intercept and divert vertically propagating threading dislocations as the material of interest is being grown vertically upward from the substrate layer of the material through the void regions between shapes. Suitable shapes include but are not restricted to spheres, spheroids, ellipsoids, cylinders, and discoids. It is intended that these shall be included in the term spheroidal particles. In using the term diameter, it is to be understood that the term is not to be construed as limited to particles that are necessarily spherical particles with uniform diameter in all directions, but may be construed to indicate more generally the lateral dimension of the particles. It is not essential that all the particles employed in a particular embodiment have the same effective diameter as long as they in concert are able to provide the desired physical effect of terminating the propagation of the threading dislocations.

While Langmuir-Blodgett techniques have been employed in the embodiments described above to produce the spatially dense layer of spheroidal particles, other techniques that can produce particles layers with substantially similar properties may be used. This would include but not be restricted to spin casting and drop casting.

In one embodiment, a GaN film was grown on a sapphire substrate. Due to lattice mismatch between the GaN and the sapphire, an initial threading dislocation density of approximately $2 \times 10^9 / cm^3$ was obtained. A layer of silica microspheres of approximately 3 micrometer diameter was applied to this GaN layer using a Langmuir-Blodgett technique. The silica microspheres self-assemble and cover the GaN surface with a coverage of approximately 83%. A GaN layer is then grown using metalorganic chemical vapor deposition (MOCVD) on the coated GaN surface, with epitaxial growth of GaN proceeding upward from the GaN through the interstices between the silica microspheres and then laterally to coalescence over the microspheres. Vertical growth of GaN continues upward from the coalesced GaN surface to form a low-dislocation-density GaN layer (approximately $4 \times 10^7 / cm^3$). Transmission electron microscopy (TEM) shows the turning blocking and bending of dislocations originating in the underlying GaN layer. TEM also shows that there are frequently small voids at the interface between the lower GaN layer and the microspheres. Such small voids can assist in the separation by weakening the interface and also by allowing better access of etchant to the nanoparticles.

To remove the low-dislocation-density GaN film from the substrate, in one embodiment the following procedure was employed. The GaN surface of the wafer was bonded to mounting wax. The wafer was then exposed to wet etch conditions suitable for dissolving the silica microspheres: 20% HF at room temperature for approximately 2 days. Substantially shorter times may also be employed providing they are sufficiently long for adequate dissolution of the silica microspheres to release the upper GaN epilayer. The delamination was spontaneous, yielding the released substrate (GaN on sapphire wafer) and the top GaN layer bonded to the wax. Standard debonding techniques can be employed to release the top GaN layer as a free-standing GaN layer.

In some embodiments, buffered oxide etchant (BOE) solutions, which comprise a mixture of $NH_4F$ and HF, may be employed. In some embodiments, a gas-phase etchant that can selective etch the microparticles versus the epilayer may be used. These include but are not restricted to gas compositions comprising $SF_6$ gas.

In some embodiments, a KOH solution can be used to etch silica microparticles. For example, a 10% KOH solution at room temperature can be employed. The KOH solution selectively etches nitrogen polar c-plane GaN to enlarge the gap between the GaN epilayer and the substrate to further weaken the adhesion between the epilayer and the substrate.

The textured surface of the single crystal layer 34 can be made into a smooth surface if desired in various embodiments via techniques including polishing, etching, or chemical mechanical polishing (CMP). The precise method used depends on the composition and crystalline nature (including orientation) of the material and degree of roughness. For GaN, CMP is most often used, which combines a mechanical polish with a chemical treatment to weaken/alter the surface to a mechanically weaker form. For GaN, a CMP process has been used to produce smooth surfaces using KOH or NaOH with silica abrasive slurries. Sodium-hypochlorite-based slurries have also been used, which is more effective at etching Ga-polar c-plane GaN. An etch-back method using a sacrificial layer can also be employed in some embodiments.

Patterned removal of regions of the GaN layer can also be performed in some embodiments of this invention. In some embodiments, patterned etching of the upper layer can be performed using an etching process suitable for the upper layer material, as known to those skilled in the etching art. One or more openings through the upper layer to expose the layer of microparticles provide access to the microparticle layer for a suitable etching solution. Etching of the microparticles can undercut the unetched portions of the regrown material layer 30 and enable release of a material layer with holes in selected regions determined by the pattern of upper-layer etching. The released layer is not restricted to a single GaN layer. It can be a multilayer film; one example would be a structure comprising an n-GaN layer, an InGaN underlayer, InGaN/GaN(AlGaInN) multiple quantum wells, an AlGaN (AlGaInN) electron block layer, and a p-GaN layer. As known to those skilled in III-nitride blue LEDs manufacturing, gridding, laser liftoff is commonly used to liftoff light emitting diode or laser diode dies from substrates. The patterned wet etch removal technique described here can be a low cost alternative to the laser liftoff techniques.

In other embodiments, different temperatures, different etchant concentrations, and different reaction times can be employed. A suitable combination will selectively dissolve enough of the microspheres to release the top GaN layer from its interface with the substrate and/or microspheres.

Insertion of a microparticle layer between an epilayer and a high-value substrate, such as growing GaN on GaN or GaN on SiC, can allow laser-free liftoff and easy recycling of the substrates. The etching process removes the microsphere layer and allows epilayer liftoff from substrates. After the epilayer removal, the substrate can be polished and used again in subsequent growths.

The method of embodiments of this invention is applicable to a wide variety of materials, both epitaxial and non-epitaxial. The epitaxial growth of low-dislocation-density material from the substrate layer can be performed with many different materials. For example, it is suitable for use with layers of various Group III nitrides, including but not restricted to GaN, InGaN, AlGaN, and AlInGaN, various III-V compound semiconductors, including but not restricted to InP, GaAs, InAs, AlAs, and various ternary and quaternary compositional variations thereof, SiGe, ZnO, and II-VI semiconductors, including but not restricted to ZnS, CdS, and CdSe The method is also applicable to nonsemiconducting materials. It is also applicable to layers of materials that are either epitaxial or non-epitaxial; significant improvement of material quality can occur when epitaxial growth is involved.

The microparticles can be of a variety of compositions. A criterion in selecting a suitable combination of etching chemistry and the composition of the microparticles is that the microparticles dissolve more rapidly in the etching chemistry than the layers to be separated. The etching chemistry can be a wet chemistry or a dry chemistry. The dry chemistry can be a thermal chemistry and/or a plasma chemistry.

The microparticles can be of a wide variety of compositions. Some compositions that are easily etched by acids and are suitable for high-temperature MOCVD processes include but are not restricted to $SiO_2$, $TiO_2$, and $Si_xN_y$. The shape of the microparticles can be one of many shapes. Microspheres are commercially available and are convenient to acquire for embodiments of this invention, but other shapes can also be employed. Suitable shapes include but are not restricted to spheres, spheroids, ellipsoids, cylinders, and discoids. It is intended that these shall be included in the term spheroidal particles. In using the term diameter, it is to be understood that the term is not to be construed as limited to particles that are necessarily spherical particles with uniform diameter in all directions, but may be construed to indicate more generally the lateral dimension of the particles. It is not essential that all the particles employed in a particular embodiment have the same effective diameter as long as they in concert are able to provide the desired physical effect of terminating the propagation of the threading dislocations. The structure of the textured surface will substantially mirror a portion of the shape of the microparticle employed.

In various embodiments, different methods can be employed for preparing the microparticle interlayer structure. For example, some methods include but are not restricted to Langmuir Blodgett coating techniques, layer-by-layer particle absorption, dip coating, spin coating, sputtering, chemical vapor deposition, plasma vapor deposition, and ALD. The interlayer may be made porous following deposition by etching before regrowth of the top layer. For example, a solid $SiO_2$ layer can be made porous using HF vapor exposure. In some embodiments, the nanoparticles are not directly applied, but are effectively manufactured in-situ by nonuniform etching of a film that has been applied to the surface by any of the techniques described above or by another suitable technique not listed above.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A method for preparing a surface-textured single-crystal film layer, the method comprising:
   preparing a layered structure comprising a substrate with a crystalline surface, a layer of microparticles atop the substrate; and a single-crystal film layer atop the layer of microparticles, wherein the single-crystal film layer is connected epitaxially to the crystalline surface of the substrate;
   selectively etching the microparticles using an etchant that etches the microparticles sufficiently rapidly to substantially etch away the solid interface between the microparticles and at least one of the substrate and the single-crystal film layer while not substantially etching the single-crystal film layer; and
   releasing the single-crystal film layer from the substrate when a sufficient amount of the microparticles have been etched away, wherein the single-crystal film layer that has been released is the surface-textured single-crystal film layer.

2. The method of claim 1, wherein the step of preparing the layered structure further comprises
   applying at least one monolayer of spheroidal particles to the substrate comprising a base substrate and a first layer of growth material, the at least one monolayer having interstices between the spheroidal particles oriented to permit access of reactant gases to the first layer of growth material;
   initiating growth of a second layer of growth material at sites on the first layer of growth material that are exposed to reactant gases through the interstices;
   growing the growth material through the interstices;
   terminating adjacent to the spheroidal particles a plurality of threading dislocations propagating through the growth material; and
   coalescing the growth material growing through adjacent interstices to form the single-crystal film layer comprising the second layer of growth material with reduced dislocation density atop the at least one monolayer of spheroidal particles.

3. The method of claim 2, wherein the step of applying the at least one monolayer of spheroidal particles comprises the steps of
   preparing the monolayer of spheroidal particles using a Langmuir Blodgett technique; and
   applying the monolayer of spheroidal particles to the first layer of growth material using a Langmuir Blodgett coating technique.

4. The method of claim 2, wherein the step of applying the at least one monolayer of spheroidal particles comprises applying a suspension of spheroidal particles to the substrate by a spin-coating technique or a drop-coating technique.

5. The method of claim 2, wherein the monolayer consists of spheroidal particles arranged substantially in a close-packed geometry.

6. The method of claim 2, wherein the spheroidal particles comprise a material selected from the group consisting of silicon dioxide, silicon nitride, silicon oxynitride $Al_2O_3$, $TiO_2$, $ZrO_2$, $Fe_3O_4$, $ZrHfO_4$, $ZrHfO_4$, $CaCO_3$, and glass.

7. The method of claim 2, wherein the step of growing the growth material through the interstices at least in part employs reaction conditions that form faceted structures suitable for promoting redirection of threading dislocations away from a vertical propagation direction.

8. The method of claim 7, wherein the step of coalescing the growth material employs reaction conditions that promote lateral growth of the growth material.

9. The method of claim 2, wherein at least one of a carrier gas and the reactant gas inhibits nucleation and growth of the growth material directly on the spheroidal particles.

10. The method of claim 2, wherein the spheroidal particles have a diameter greater than approximately 100 nm and less than approximately 100 micrometers.

11. The method of claim 2, wherein the growth material is a Group III nitride.

12. The method of claim 2, wherein the steps of initiating growth, growing the growth material, terminating the plurality of threading dislocations, and coalescing the growth materials are performed in a chemical vapor deposition reactor or a hydride vapor phase reactor.

13. The method of claim 1, wherein a texture of the surface-textured single-crystal film layer comprises an array of concavities of substantially inverse spherical profile.

14. The method of claim 1, wherein the single-crystal film layer is a compound semiconductor material selected from the group consisting of GaN, InGaN, AlGaN, AlInGaN, ternary Group III nitrides, quaternary Group III nitrides, InP, GaAs, InAs, AlAs, ternary Group III arsenides, quaternary Group III arsenides, SiGe, ZnO, and III-VI semiconductors.

15. The method of claim 1, wherein the layer of microparticles comprises at plurality of monolayers of microparticles.

16. The method of claim 1, wherein the layer of microparticles comprise silica microparticles and the etchant is comprises at least one of an HF solution, a buffered oxide etching solution, a KOH solution, and $SF_6$.

17. The method of claim 1, further comprising at least one of etching and polishing the single-crystal film layer.

18. The method of claim 1, wherein the single crystal film layer is a Group III nitride and the microparticles are silica microparticles.

* * * * *